(12) United States Patent
Thalheim

(10) Patent No.: US 7,071,661 B2
(45) Date of Patent: Jul. 4, 2006

(54) METHOD FOR THE DYNAMICALLY BALANCING SERIES- AND PARALLEL-WIRED POWER SEMICONDUCTOR CIRCUITS

(75) Inventor: Jan Thalheim, Löhrenweg (CH)

(73) Assignee: CT Concept Techmologie AG, Biel (CH)

( * ) Notice: Subject to any disclaimer, the term of this patent is extended or adjusted under 35 U.S.C. 154(b) by 341 days.

(21) Appl. No.: 10/451,325

(22) PCT Filed: Dec. 27, 2000

(86) PCT No.: PCT/IB00/01968

§ 371 (c)(1),
(2), (4) Date: Oct. 28, 2003

(87) PCT Pub. No.: WO02/052726

PCT Pub. Date: Jul. 4, 2002

(65) Prior Publication Data

US 2004/0056646 A1 Mar. 25, 2004

(51) Int. Cl.
*G05F 1/40* (2006.01)

(52) U.S. Cl. ..................................................... 323/268

(58) Field of Classification Search .............. 363/21.06, 363/21.14, 97, 98, 131, 132; 323/265–273, 323/282

See application file for complete search history.

(56) References Cited

U.S. PATENT DOCUMENTS

| | | | | |
|---|---|---|---|---|
| 5,566,063 A | | 10/1996 | Gerster et al. | 363/98 |
| 5,627,412 A | * | 5/1997 | Beard | 307/82 |
| 6,091,234 A | * | 7/2000 | Kitagawa | 323/244 |
| 6,275,014 B1 | * | 8/2001 | Sudo | 323/222 |
| 6,292,380 B1 | * | 9/2001 | Diallo et al. | 363/89 |

FOREIGN PATENT DOCUMENTS

| | | |
|---|---|---|
| DE | 198 38 389 | 3/1992 |
| EP | 0 409 384 | 1/1991 |
| EP | 0 664 613 | 7/1995 |

OTHER PUBLICATIONS

Christian Gerster, et al.: *Gate–control strategies for snubberless operation of series conected IGBTs*, IEEE Power Electronics Specialists Conference PESC96, Baveno, Italy, vol. 2, pp. 1739–1742, 1996.

(Continued)

*Primary Examiner*—Matthew V. Nguyen
(74) *Attorney, Agent, or Firm*—Kenyon & Kenyon

(57) ABSTRACT

A method for dynamically balancing the loads in a circuit (1, 4) of semiconductor power switches arranged in series or in parallel is disclosed. Individual switching signals ($i_{G1}$, $i_{G2}$) for the semiconductor power switches ($S_1 \ldots S_4$) are generated by determining a system-widely valid synchronous sampling time ($ts_j$) independently for each semiconductor power switch ($S_1 \ldots S_4$) due to a synchronous event (es) of the whole circuit (1, 4). Control loop offsets between actual values ($a_i$) measured synchronously at the sampling time ($ts_j$) and given desired values ($a_s$) of an asynchronous state variable ($a(t)$) of the semiconductor power switches ($S_1 \ldots S_4$) are reduced in the same or in following switching cycles. Alternatively, control loop offsets between actual time values ($ta_i$) and desired time values ($ta_s$) are minimized, wherein the actual time values ($ta_i$) are measured upon exceeding a globally provided threshold value ($\epsilon_a$) of an asynchronous state variable ($a(t)$) of the semiconductor power switches ($S_1 \ldots S_4$). Embodiments relate to: Offsetting the sampling time ($ts_j$) in time by a globally provided time interval ($\Delta t0$), providing desired values locally or globally, e.g. by averaging of actual values ($a_i$, $ta_i$), additional balancing of the gradients of asynchronous time variables ($a(t)$). A central sampling command can be dispensed with and the switching synchronicity is improved, switching times are shortened and dynamic switching losses are reduced.

33 Claims, 3 Drawing Sheets

OTHER PUBLICATIONS

Christian Gerster: *Fast High–power/High–voltage Switch Using Series–connected IGBTs with Active Gate–controlled Voltage–balancing* Applied Power Electronics Conference and Exposition, vol. 1, pp. 469–472, IEEE, New York (1994).

* cited by examiner

METHOD FOR THE DYNAMICALLY BALANCING SERIES- AND PARALLEL-WIRED POWER SEMICONDUCTOR CIRCUITS

This application is a 371 national phase application of PCT/IB00/01968 filed on 27 Dec. 2000, the content of which is incorporated herein by reference in its entirety.

TECHNICAL FIELD

The invention lies in the field of power electronics. It relates to a method for dynamically balancing power semiconductor switches according to the preamble of the independent claims.

STATE OF THE ART

Such a method for dynamically synchronizing power semiconductor switches in series has been disclosed in the article of C. Gerster, "Fast High-power/High-voltage Switch Using Series-connected IGBTs with Active Gate-controlled Voltage-balancing", Proceedings of 1994 Applied Power Electronics Conference and Exposition, Vol. 1, pp. 469–472, IEEE, New York (1994). A sampling time that is valid system-wide is provided by a central control. At this sampling time, the individual collector-emitter voltages of the IGBTs are determined by means of local measuring systems and individual difference voltages or control loop offsets are determined from the actual values and a given reference value. In the following switching cycles, the switching commands are delayed for each IGBT individually in such a way that the control loop offsets are minimized and the collector-emitter voltages are balanced. A problem in this method are uncontrolled time deviations in the signal transmissions from the central control to the local measuring systems. The maximum voltage rise gradients are limited by the uncompensated deviations between the transmission times. In particular when using low-cost optical connections with large variance of the transmission times, the switching time must therefore be decreased and increased dynamic losses must be accepted. A further problem consists in the fact that the relation between the control loop offsets and the required time delays is comparatively undetermined and, at best, known empirically, and corrections can only be carried out in the following switching cycles. In addition, the method also requires an adaptation of the central sampling time within a limited time window. Furthermore, an analog-digital converter is required for feeding the actual values in digitized form to the central control.

SUMMARY OF THE INVENTION

It is an object of the invention to provide an improved method for dynamically balancing semiconductor power switches where an exact synchronization of the individual semiconductor power switches and a high switching speed of the complete circuit can be achieved.

In a first aspect, the solution according to the invention consists of a method for dynamically balancing a circuit of semiconductor power switches, wherein each semiconductor power switch comprises a first power terminal or collector, a second power terminal or emitter and at least one control terminal or gate, wherein a switching command for initiating a switching process of the circuit is fed, in particular from a central control, to the control terminal, and the control terminal can also be driven by means of an individual switching signal depending on a control loop offset of a state function of the semiconductor power switch, wherein, further, the state function is a time-dependent asynchronous state variable, an actual value of which is measured at at least one synchronous sampling time, wherein the synchronous sampling time is determined based on a synchronous event of the circuit for each semiconductor power switch individually, and, in the same or in one of the following switching cycles, the switching signal is offset in time or its amplitude is varied such that the control loop offset between the actual value and a predefined desired value is reduced. By locally generating the synchronous sampling times, there is no more need to distribute a central sampling command in time synchronous manner to the circuits or gate drivers of the semiconductor power switches. The synchronicity is still guaranteed by the fact that the synchronous event generates, at each semiconductor power switch, the same values of the state variable or another detectable value.

In one embodiment, the synchronous sampling time is locally determined at each semiconductor power switch. The synchronous sampling time can be determined by shifting a reference time of the synchronous event forward or backward in time by a time interval that is given in common to all semiconductor power switches. In this way, the sampling time can be set to a time of the switching process that can be defined in flexible manner, wherein the time interval can be transmitted in not time critical manner and be locally stored in each gate driver.

Another embodiment relates to a determination of the desired value of the asynchronous time variable in global manner from an average of the actual values of a plurality or all asynchronous state variables. Since the desired value is only required for calculating the control loop offset, its transmission is not time-critical in the case of a global desired value. Alternatively, or in addition, the desired value can be chosen by the semiconductor power switches locally and in particular equal to an offset from a stationary value of the asynchronous state variable, which offset is smaller than 10% of an expected value of a maximum amplitude of the asynchronous state variable. Preferably, for the switch-on process of a series circuit or the switch-off process of a parallel circuit, DC components of the desired value and of the actual value of the asynchronous time variable are subtracted in order to simplify electronic processing.

In a further embodiment, actual values are measured at two synchronous sampling times and the control loop offset is determined from their gradient and from a desired gradient value, and an amplitude of the switching signal for which the control loop offset corresponds to a too high or too low gradient is decreased or increased in the same or one of the next switching cycles. In particular, a first sampling time is chosen closer in time to a reference time of the synchronous event and a difference between the sampling times is approximated by a second sampling time. By means of the additional gradient control, the accuracy of the dynamic synchronicity of the switching behavior of the semiconductor power switches can be improved again.

In a second aspect, the solution according to the invention consists of a method for dynamically balancing a circuit of semiconductor power switches, wherein each semiconductor power switch comprises a first power terminal or collector, a second power terminal or emitter and at least one control terminal or gate, wherein a switching command for initiating a switching process of the circuit is fed to the control terminal, and the control terminal can be driven by means of an individual switching signal depending on a control loop offset of a state function of the semiconductor power switch, wherein, furthermore, the state function is chosen equal to a time function in dependence of an asynchronous state variable of the semiconductor power switch, wherein at least one threshold value common to the semiconductor power switches is globally provided for the asynchronous state variable, an individual actual time value being measured for each semiconductor power switch upon exceeding or crossing or reaching the threshold value, a reference time for the actual time value is locally defined by means of a synchronous event of the circuit, and in the same or one of the following switching cycles the switching signal is offset in time or its amplitude is varied such that the control loop offset between the actual time value and a predefined desired time value is reduced. By using the inverse function of a time-dependent asynchronous state variable, the degree of the asynchronicity of the semiconductor power switches can be assessed from the exceeding of the global threshold value and be individually corrected at each semiconductor power switch.

In corresponding embodiments, the desired time value is determined globally from a maximum of the actual time values or is chosen locally. Again, the transmission of a global desired value is not time critical. The control loop offset can be determined locally from a difference between the actual time value and the desired value, or the reference time can be chosen to be close to the desired time value, and the control loop offset can be approximated by the actual time value and/or the switching signal can be initially delayed and/or its amplitude can be initially reduced. By the last mentioned measure, asynchronously switching semiconductor power switches can be switched on in delayed manner as well as early, and their amplitude can be increased as well as decreased. Finally, actual time values can be measured at two threshold values of the asynchronous state variable, the control loop offset can be determined from their gradient and from a desired gradient value, and an amplitude of the switching signal, for which the control loop offset corresponds to a too high or two low gradient, can be decreased or increased in the same or in a next switching cycle.

Examples for asynchronous state variables are, in a series circuit, a collector-emitter or anode-cathode voltage or a collector-emitter voltage gradient or anode-cathode voltage gradient or, in a parallel circuit, a collector or anode current or a collector current gradient or anode current gradient. Examples for a synchronous state variable are, in a series circuit, a collector or anode current or a collector current gradient or anode current gradient or, in a parallel circuit, a collector-emitter or anode-cathode voltage or a collector-emitter voltage gradient or anode-cathode voltage gradient.

Examples for a synchronous event are the exceeding or crossing or reaching a given threshold value of a synchronous state variable or opposite changes in amplitude of asynchronous state variables of different semiconductor power switches. In particular, the synchronous event is chosen at the beginning of the switching process by choosing an offset of the threshold value from a stationary value of the synchronous state variable to be smaller than 10% of an expected value of a maximum amplitude of the synchronous state variable.

In further embodiments, for a switch-off process of a parallel circuit, the synchronous event is defined approximately by the time at which in a phase A, in which the free wheeling diode is in a conducting state, the asynchronous state variable falls below, or crosses or reaches, a given threshold value. Or, for a switch-on process of a series circuit, the synchronous event is defined approximately by the time when in a phase B, during which the free wheeling diode is in a blocking state, the asynchronous state variable falls below, or crosses or reaches, a given threshold value. Alternatively, the synchronous event can be defined by a change between a phase A, during which a free wheeling diode arranged in series to the circuit is in a conducting state, and a phase B, in which the free wheeling diode is in a blocking state. The change can be from A to B or from B to A. It is also possible to choose, for a switch-off process of a parallel circuit, a reference time of the synchronous event to be equal to a time when a collector-emitter or anode-cathode voltage exceeds a threshold value and a collector-emitter or anode-cathode gradient falls below a threshold value, in particular a threshold value of zero. Or one can choose, for the switch-on process of a series circuit, a reference time of the synchronous event to be equal to a time when a collector-emitter or anode-cathode voltage falls below a threshold value. In particular, the threshold value can be chosen to be smaller than an expected value of the collector-emitter or anode-cathode voltage at the end of a phase A.

Further embodiments, advantages and applications of the invention are given in the dependent claims as well as in the now following description, which makes reference to the figures.

BRIEF DESCRIPTION OF THE DRAWINGS

In the figure, similar parts are designated with the same reference signs.

DETAILED DESCRIPTION

Figure 1A:
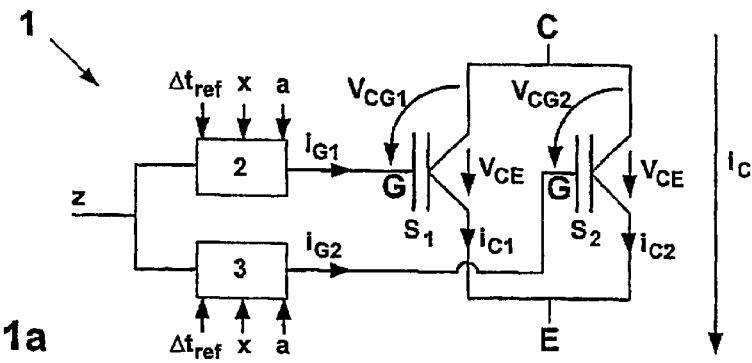
FIG. 1a schematically shows a parallel circuit with, as an example, two semiconductor power switches as well as a switch-on process (FIG. 1b) and a switch-off process (FIG. 1c) for the parallel circuit.

In FIG. 1a, each one of two parallel semiconductor power switches $S_1$ and $S_2$ is driven by a dedicated gate driver 2, 3, Each gate driver 2, 3 receives a central switching command z as well as, in addition, a desired time interval value $\Delta t_{ref}$ as well as actual values and desired values of at least one synchronous event or a synchronous variable x and of at least one asynchronous variable a. Typically, the actual values x and a are measured locally at the semiconductor power switch $S_1$ or $S_2$. In gate driver 2, 3 a control signal or switching signal, namely a gate current $i_{G1}$, $i_{G2}$ or a gate voltage $v_{CG1}$, $v_{CG2}$ or a time integral of the gate current $i_{G1}$, $i_{G2}$ is generated based on the input values z, $\Delta t_{ref}$, x and a, and fed to the control terminal or the gate G of the semiconductor power switch $S_1$ or $S_2$. The collector-emitter voltage $v_{CE}$ (where applicable also called the anode-cathode voltage) is identical over the two semiconductor power switches $S_1$ and $S_2$ in the parallel circuit 1 and represents a synchronous state variable. Due to the different switching behavior of the semiconductor power switches $S_1$ and $S_2$, the collector currents $i_{C1}$, $i_{C2}$ (where applicable also called anode currents) can, however, differ form each other and have to be balanced dynamically.

Figure 1B:
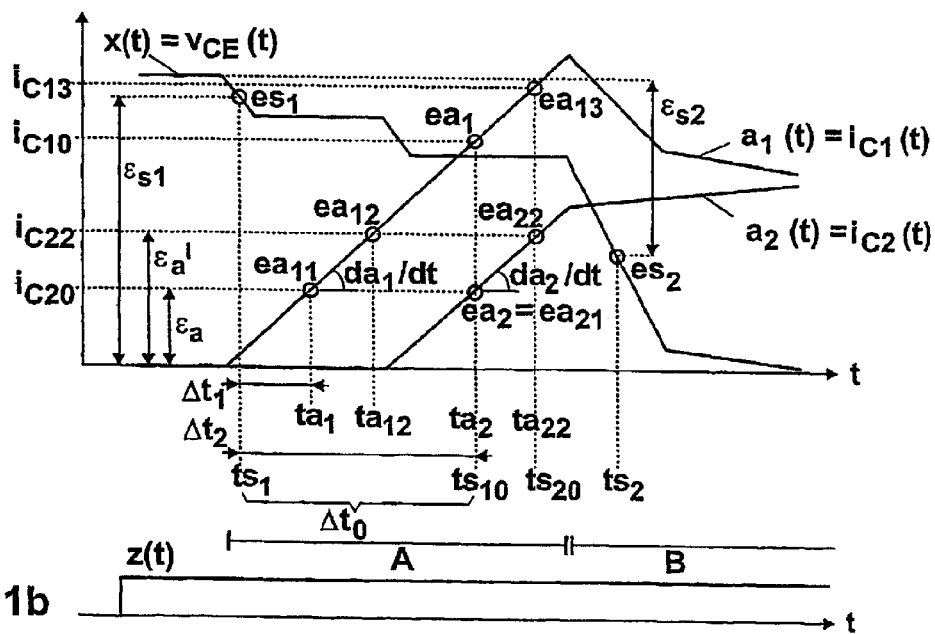

FIG. 1b shows the typical time dependence of the switching command z(t), the synchronous state function or (time-dependent) state variable $x(t)=v_{CE}(t)$ and the asynchronous state function or (time-dependent) state variable $a_1(t)=i_{C1}(t)$ and $a_2(t)=i_{C2}(t)$ for a switch-on process. In the shown embodiment, $a_1(t)$ is too early and/or $a_2(t)$ is too late. The collector currents $i_{C1}(t)$, $i_{C2}(t)$ are measured by integrating the voltage drop over an inductance in the power circuit, e.g. the emitter inductance. Preferably, the beginning of the integration interval is chosen to be close to the beginning of a main transient of the collector current $i_{C1}(t)$, $i_{C2}(t)$ to be measured. This minimizes a drift due to offset in the integrated signal. In the following, four method according to the invention are given for dynamically balancing $a_1(t)$ and $a_2(t)$.

In a first case a synchronous event $es_1$ is defined by providing a threshold value $\epsilon_{s1}$ for the synchronous state variable $x(t)$. The reaching, in the present case the falling below, the threshold value $\epsilon_{s1}$, is measured locally at each semiconductor power switch $S_1$, $S_2$, or, possibly, for a group of spatially close semiconductor power switches, and the corresponding reference time $ts_1$ is recorded. By addition of a time interval $\Delta t_0$ to the reference time $ts_1$ a sampling time $ts_{10}$ is generated, at which the actual values $i_{C10}$ and $i_{C20}$ are measured for the asynchronous events $ea_1$ and $ea_2$ on the curve traces of the asynchronous state variables $a_1(t)$ and $a_2(t)$. In a control loop, which is not shown in detail, the actual values $i_{C10}$ and $i_{C20}$ are compared to given desired values, a control loop offset is determined, and the individual switching signals $i_{C1}$ and $i_{C2}$ are moved forward or backward in time and/or changed in amplitude such that in the same or in following switching cycles the control loop offset is reduced. In this manner, the asynchronous state variables $a_1(t)$ and $a_2(t)$ are substantially brought into correspondence for at least a substantial part of the switching process, i.e. the asynchronous state variables $a_1(t)$ and $a_2(t)$ become synchronous, all semiconductor power switches $S_1$, $S_2$ carry substantially the same collector current $i_{C1}(t) \approx i_{C2}(t)$ and the same thermal load. The switching times can be chosen to be extremely short while maintaining a high synchronicity, namely in a range below 1 µs, preferably below 500 ns, and particularly preferably below 100 ns, and the dynamic switching losses are minimized correspondingly.

In a second case an actual gradient value can be measured for at least one of the asynchronous state variables $a_1(t)$ and $a_2(t)$, be compared to a desired gradient value, and a corresponding control loop offset can be reduced in the same or in a following switching cycle. For this purpose, at least a second scanning time $ts_{20}$ is generated, the actual values $i_{C22}$ and $i_{C13}$ are determined for the corresponding asynchronous events $ea_{22}$ and $ea_{13}$, and actual gradient values $da_2/dt$ and/or $da_1/dt$ are formed from two corresponding actual values $i_{C10}$, $i_{C13}$; $i_{C20}$, $i_{C22}$ and the difference of the sampling times $ts_{20}-ts_{10}$.

In a third case, a common or global threshold value $\epsilon_a$ for the asynchronous state variables $a_1(t)$ and $a_2(t)$ is provided and the actual time-values $ta_1$ and $ta_2$ for the asynchronous events $ea_{21}$ and $ea_{11}$ are measured upon exceeding the threshold value $\epsilon_a$. Again, $ts_1$ is used as a reference time, and $ta_1$ is expressed by the difference $\Delta t_1=ta_1-ts_1$ and $ta_2$ by the difference $\Delta t_2=ta_2-ts_1$. A control loop offset is preferably calculated proportional to the difference of the actual time values $ta_2-ta_1=\Delta t_2-\Delta_1$ and minimized by varying the individual switching signals.

In a fourth case, two threshold values $\epsilon_a$ and $\epsilon_a'$ are provided, the actual time values $ta_1$, $ta_{12}$, $ta_2$ and $ta_{22}$ are measured for the corresponding asynchronous events $ea_{11}$, $ea_{12}$, $ea_{21}$ and $ea_{22}$, actual gradient values $da_2/dt$ and $da_1/dt$ are calculated from the differences of the threshold values $\epsilon_a'-\epsilon_a$ and the corresponding actual time values $ta_{12}-ta_1$ and $ta_{22}-ta_2$, and the control loop offset is determined by comparison with desired gradient values.

In the above cases the reference time $ts_1$ of the synchronous event $es_1$, the sampling times $ts_{10}$ and $ts_{20}$ and asynchronous actual values $ta_1$, $ta_{12}$, $ta_2$, $ta_{22}$ are preferably set into a phase A of the switching process, during which a free wheeling diode $D_S$ (FIG. 4b) arranged in series to circuit 1 is in a conducting state. The reference time $ts_1$ in phase A can also be replaced by a reference time $ts_2$ of a second synchronous event $es_2$ in a phase B, during which the free wheeling diode $D_S$ is in a blocking state. The second synchronous event $es_2$ is defined by the synchronous state variable $x(t)$ exceeding or falling below a threshold value $\epsilon_{s2}$, which is defined in reference to a stationary value of the synchronous state variable $x(t)$ before (as shown) or after the switching process.

Figure 1C:
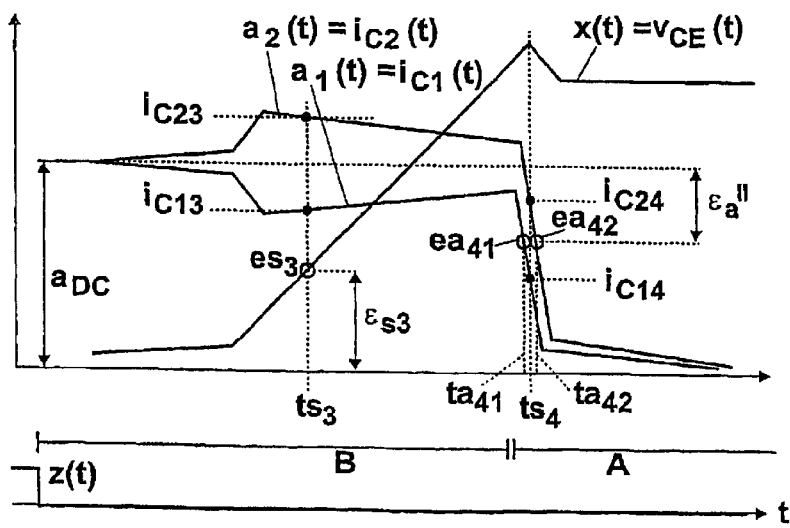

FIG. 1c shows a typical switch-off process for the parallel circuit 1. Three cases are discussed as examples. A reference time, which is also a sampling time, can be provided by providing a threshold value $\epsilon_{a3}$ for a synchronous event $es_3$ of the synchronous state function $x(t)=v_{CE}(t)$ in phase B. The actual values $i_{C13}$, $i_{C23}$ of the asynchronous state functions $a_1(t)=i_{C1}(t)$ and $a_2(t)=i_{C2}(t)$ are compared to a desired value, e.g. the stationary value before initiating the switching process by the switching command $z(t)$, and the corresponding control loop offsets are minimized for balancing the semiconductor power switches $S_1$ and $S_2$ during the switch-off process. Alternatively, a reference time, which is also a sampling time $ts_4$, can be defined by the synchronous event of a transition from phase B to phase A. Again, the difference between the asynchronous actual values $i_{C14}$ and $i_{C24}$ is a measure for the control loop offset and the asynchronicity and is to be minimized. In a third embodiment, a threshold value $\epsilon_a''$ below the stationary value $a_{DC}$ before switch-off is provided, the actual time values $ta_{41}$ and $ta_{42}$ in reference to a reference time $ts_3$ or $ts_4$ are determined for the asynchronous events $ea_{41}$ and $ea_{42}$ in phase B, and the control loop offset is calculated by comparison with a desired value.

Figure 2A:
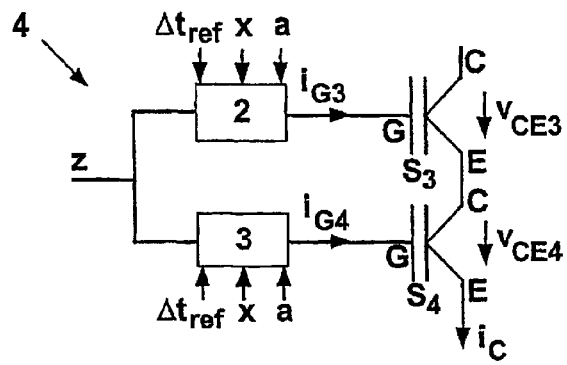
FIG. 2a schematically shows a series circuit with, as an example, two semiconductor power switches as well as a switch-on process (FIG. 2b) and a switch-off process (FIG. 2c) for the series circuit.
Figure 2B:
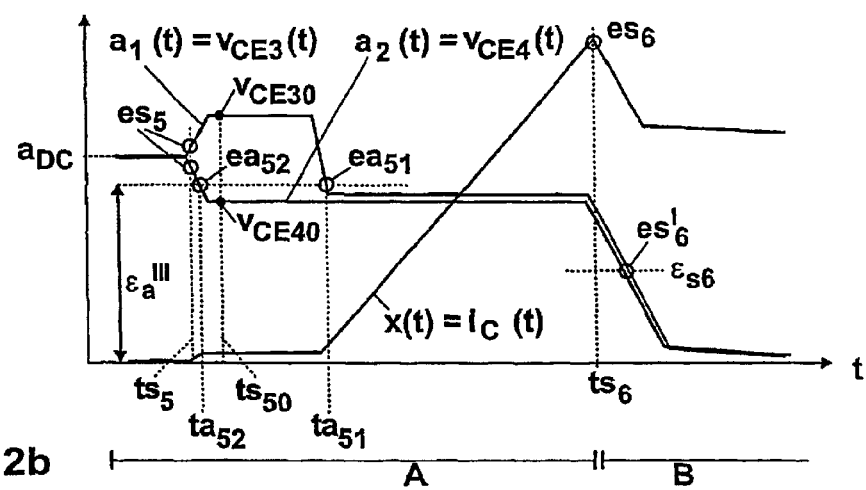

FIG. 2a shows the case of a series circuit 4 of, for example, two semiconductor power switches $S_3$ and $S_4$ with individual or asynchronous collector-emitter voltages $v_{CE3}$ and $v_{CE4}$ (where applicable also called anode-cathode voltages) and a synchronous collector current $i_c$ (where applicable also called anode current), as well as the gate currents $i_{G3}$ and $i_{G4}$. FIG. 2b shows the switch-on process. A reference time can basically be defined, as before, by means of a synchronous event on the synchronous state function $x(t)=i_c(t)$ (not shown). A quasi-synchronous event $es_5$ occurs at the reference $ts_5$ when at least two asynchronous state variables $a_1(t)=V_{CE3}(t)$ and $a_2(t)=V_{CE4}(t)$ suffer detectable, opposite changes. The sampling time $ts_{50}$ is set into phase A such that, for asynchronous switching, different actual values $v_{CE30}$ and $v_{CE40}$ of the asynchronous state variables can be measured and from these a control loop offset can be determined. Alternatively to choosing a sampling time $ts_{50}$, a global threshold value $e_a'''$ for the asynchronous state variables $a_1(t)$ and $a_2(t)$ can be provided as well, and the control loop offsets are determined from the corresponding actual values $ea_{51}$ and $ea_{52}$. As a reference time $ts_6$ of a synchronous event $es_6$, the transition time between phases A and B can be used as well. A reference time of a synchronous event $es_{6'}$ in phase B can also be defined by the time a collector-emitter voltage $v_{ce}$ drops below a threshold value $e_{s6}$, which is in particular smaller than an expected value of the collector-emitter voltage $v_{ce}$ at the end of phase A.

Figure 2C:
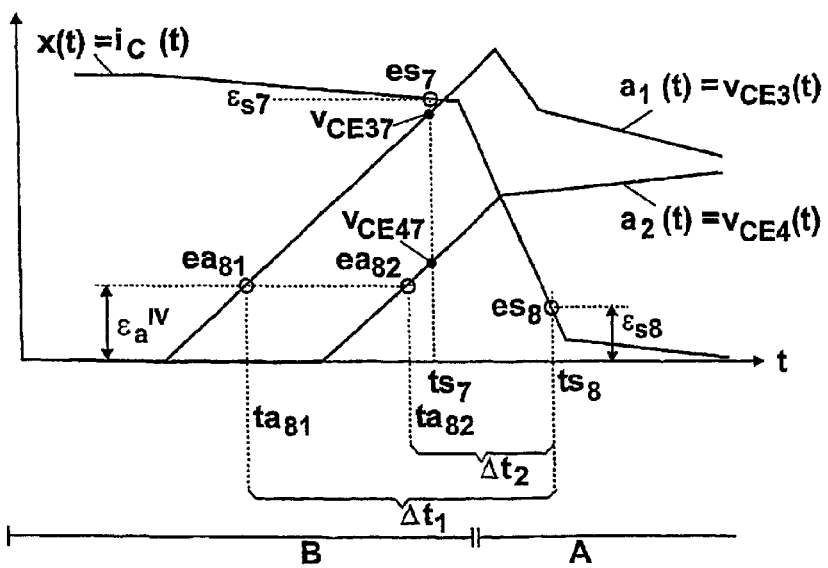

FIG. 2c shows the switch-off process. As examples, a detection of asynchronous actual values $v_{CE37}$ and $v_{CE47}$ at a synchronous sampling time $ts_7$, typically in phase B, are shown. Alternatively, a global threshold value $e_{s8}$ for defining a reference time $ts_8$ on the synchronous state function $x(t)=i_c(t)$ can be provided in phase A, and the asynchronous actual values $ta_{81}$ and $ta_{82}$ can be determined for the asynchronous state functions $a_1(t)=v_{CE3}(t)$ and $a_2(t)=v_{CE4}(t)$.

The calculation of control loop offsets from the actual and desired values is carried out as described above. In general it can be said that the switching signal for which the control loop offset corresponds to a premature actual value as compared to a desired value or a premature actual time value as compared to a desired time value must be delayed in time or reduced in amplitude, or that the switching signal for which the control loop offsets corresponds to a delayed actual value as compared to a desired value or a delayed actual time value as compared to a desired time value must be moved forward in time or increased in amplitude.

Figure 3:
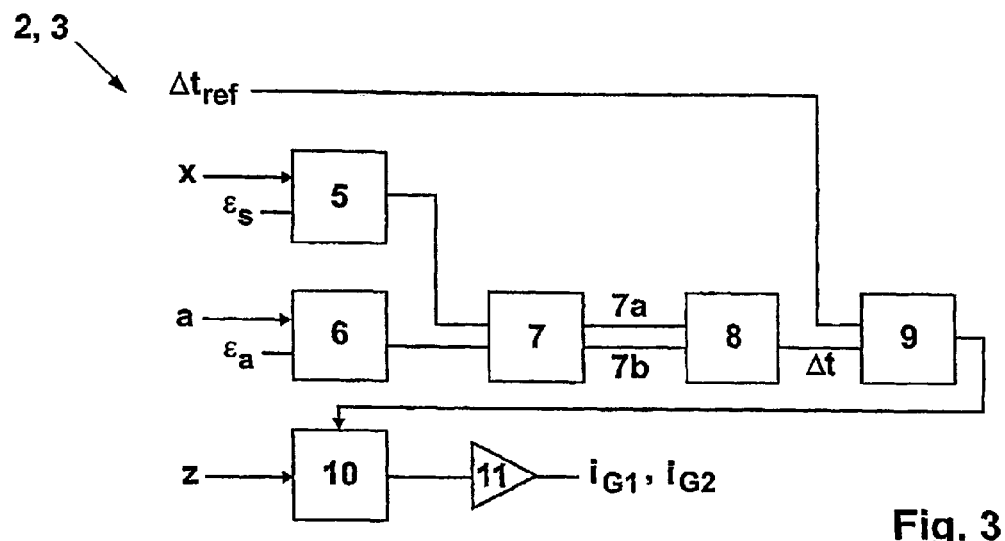
FIG. 3 is a block diagram showing the function of a gate driver according to the invention.

FIG. 3 shows a block circuit diagram of the functions of a gate driver 2, 3 according to the invention. 5 designates a threshold value switch for at least one synchronous state variable $x(t)$ and at least one corresponding threshold value $\epsilon_s$ ($\epsilon_{s1}$, $\epsilon_{s2}$, $\epsilon_{s3}$, $\epsilon_{s5}$, $\epsilon_{s6}$, $\epsilon_{s7}$, $\epsilon_{s8}$). 6 designates a threshold value switch for asynchronous state variables a or $a(t)$ ($a_1(t)$, $a_2(t)$) and at least one corresponding threshold value $\epsilon_a$ ($\epsilon_a$, $\epsilon_a'$, $\epsilon_a''$, $\epsilon_a'''$, $\epsilon_a^{iv}$). Regarding the used notation it is to be pointed out that, in general, actual values and desired values for the asynchronous state functions $a(t)$ can be designated as $a_i$ and $a_s$ and for the synchronous state functions $x(t)$ as $x_i$ and $x_s$, the synchronous events $es_1 \ldots es_3$, $es_5 \ldots es_8$ as es, the asynchronous events $ea_1$, $ea_2$, $ea_{11}$, $ea_{12}$, $ea_{13}$, $ea_{21}$, $ea_{22}$, $ea_{41}$, $ea_{42}$, $ea_{51}$, $ea_{52}$, $ea_{81}$, $ea_{82}$ as $e_a$, the reference times $ts_1 \ldots ts_8$ as ts, the sampling times $ts_{10}$, $ts_{20}$, $ts_3$, $ts_4$, $ts_{50}$ as $ts_j$, the asynchronous actual time values $ta_1$, $ta_{12}$, $ta_2$, $ta_{22}$, $ta_{41}$, $ta_{42}$, $ta_{51}$, $ta_{52}$, $ta_{81}$, $ta_{82}$ as $ta_i$ and the corresponding desired values as $ta_s$. Furthermore, $t(a)$ designates a time function in dependence of an asynchronous state variable. The clock 7 issues a start signal 7a at the first signal x or a and a stop signal 7b at the second signal a or x for the counter 8, which generates an actual time interval value $\Delta t$, which is compared to the desired time interval value $\Delta t_{ref}$ in a difference amplifier 9. The value of the comparison or difference is used, together with the switching command z, for driving a controllable delay circuit 10, which in its turn drives a gate current generator 11 for generating the desired gate current $i_{G1}$ or $i_{G2}$ or, in general, the individual switching signal.

Figures 4A, 4B:
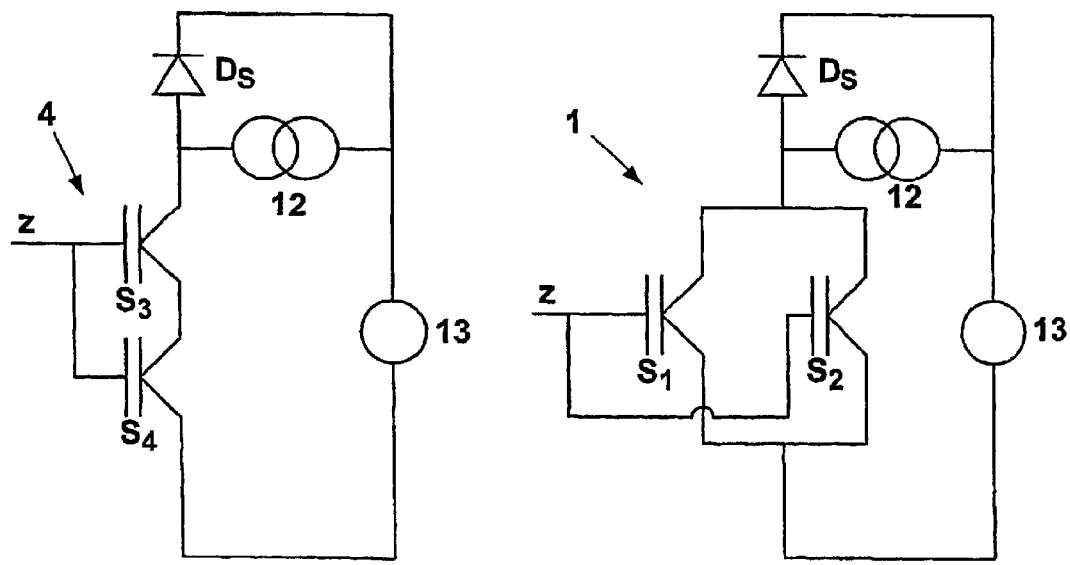
FIG. 4a is a series circuit and FIG. 4b a parallel circuit, each with a free wheeling diode arranged in series.

A free wheeling diode $D_S$ arranged in series to the semiconductor power switch circuit 1, 4 as well as the power circuit as well as a voltage source 13 and a load 12 are shown in FIG. 4 a for a series circuit 4 and in FIG. 4b for a parallel circuit 1.

The circuit 1, 4 can be part of a switching module, in particular of a half bridge arm of an inverter, for traction, high voltage DC transmission, radio emitters, inductive heating or inductive welding. The circuit 1, 4 can be a parallel circuit 4, a series circuit 1 or a combination of parallel and series circuits 4, 1. The semiconductor power switches $S_1$–$S_4$ can e.g. be BJTs, IGBTs, MOSFETs, thyristors, GTOs, MCTs ore combinations of such devices.

All in all, the invention achieves a balancing of the dynamic switching behavior of semiconductor power switches independently from a central switching command z by the fact that asynchronous events of the semiconductor power switches $S_1$–$S_4$ are detected in relation to synchronous events of the circuit 1, 4 by local measuring systems and are substantially synchronized. In principle, the switching command z can also be issued at least partially in decentralized manner. For example, at least a first semiconductor power switch $S_1$ can receive the switching command z from a central control and can forward it to second semiconductor power switches $S_2$–$S_4$. The other semiconductor power switches $S_2$–$S_4$ can, however, also detect the switching process themselves and generate local switching commands, e.g. due to the observation of changes of their synchronous or asynchronous state variables $x(t)$ and/or $a(t)$.

What is claimed is:

1. A method for dynamically balancing a circuit of semiconductor power switches, wherein each semiconductor power switch comprises a first power terminal or collector, a second power terminal or emitter and at Least one control terminal or gate, wherein a switching command for initiating a switching process of the circuit is fed to the control terminal and the control terminal can be driven by means of an individual switching signal depending on a control loop offset of a state function of the semiconductor power switch, wherein:

a) the state function is a time-dependent asynchronous state variable, an actual value of which is measured at at least one synchronous sampling time, wherein the synchronous sampling time is determined based on a synchronous event of the circuit for each semiconductor power switch individually, and b) in the same or in one of the following switching cycles the switching signal is offset in time or its amplitude is varied such that the control loop offset between the actual value and a predefined desired value is reduced.

2. The method of claim 1, wherein the synchronous sampling time is determined locally at each semiconductor power switch.

3. The method of claim 1, wherein the desired value of the asynchronous state variable is determined globally from an average value of the actual values of a plurality or of all asynchronous state variables.

4. The method of claim 1, wherein actual values are measured at two synchronous sampling times and the control loop offset is determined from their gradient and a desired gradient value.

5. A method for dynamically balancing a circuit of semiconductor power switches, wherein each semiconductor power switch comprises a first power terminal or collector, a second power terminal or emitter and at least one control terminal or gate, wherein a switching command for initiating a switching process of the circuit is fed to the control terminal and the control terminal can be driven by means of an individual switching signal depending on a control loop offset of a state function of the semiconductor power switch, characterized in that wherein:

a) the state function is chosen equal to a time function in dependence of an asynchronous state variable of the semiconductor power switch, wherein at least one threshold value common to the semiconductor power switches is globally provided for the asynchronous state variable, an individual actual time value being measured for each semiconductor power switch upon exceeding the threshold value, b) a reference time for the actual time value is locally defined by means of a synchronous event of the circuit, and c) in the same or one of the following switching cycles the switching signal is offset in time or its amplitude is varied such that the control loop offset between the actual time value and a predefined desired time value is reduced.

6. The method of claim 5, wherein the desired time value is determined globally from a maximum of the actual time values or the desired time value is chosen locally.

7. The method of claim 5, wherein for each semiconductor power switch
the control loop offset is determined locally from a difference between the actual time value and the desired time value.

8. The method of claim 5, wherein
a) actual time values are measured at two threshold values of the asynchronous state variable and wherein the control loop offset is determined from their gradient and from a desired gradient value, and
b) an amplitude of the switching signal for which the control loop offset corresponds to an too high or too low gradient, is decreased or increased in the same or in a next switching cycle.

9. The method of claim 1, wherein
a) for a series circuit, a collector-emitter or an anode-cathode voltage or a collector-emitter or anode-cathode voltage gradient is chosen as asynchronous state variable, or, for a parallel circuit a collector or anode current or a collector current gradient or an anode current gradient, and/or
b) for a series circuit, a collector current or an anode current or a collector current gradient or an anode current gradient is chosen as a synphronous state variable or, for a parallel circuit, a collector-emitter or anode-cathode voltage or a collector-emitter or anode-cathode voltage gradient.

10. The method of claim 1, wherein
the synchronous event is defined by exceeding or crossing or reaching a given threshold value of a synchronous state variable 11. The method of claim 1, whrerin
for a switch-off process of a parallel circuit, the synchronous event is defined approximately by the time when in a phase A, in which a free wheeling diode arranged in series to the parallel circuit is in a conducting state, the asynchronous state variable falls below a given threshold value.

12. The method of claim 1, wherein,
for a switch-off process of a parallel circuit a reference time of the synchronous event is chosen to be equal to a time when a collector-emitter or anode-cathode voltage exceeds a threshold value and a collector-emitter or anode-cathode gradient falls below a threshold value, in particular a threshold value of zero.

13. The method of claim 1, wherein,
a) the switching signal for which the control loop offset corresponds to a premature actual value in relation to a desired value or to a premature actual time value in relation to a desired time value is delayed time or reduced in amplitude or
b) the switching signal for which the control loop ooffset corresponds to a late actual value in relation to a desired value or to a late actual time value in relation to a desired time value is offset to an earlier time or increased in amplitude and 14. The method of claim 1, wherein the switching command is transferred from a central control to at least one first semiconductor power switch and from there local switch-on commands are issued to second semiconductor power switches.

15. The method of claim 1, wherein
the circuit is part of a switching module, in particular a half bridge arm of an inverter, for traction, high voltage DC transmission, radio emitters, inductive heating or inductive welding.

16. The method of claim 1, wherein the synchronous sampling time is determined by shifting a reference time of the synchronous event back or forward in time by a time interval predefined in common for the semiconductor power switches.

17. The method of claim 1, wherein the desired value of the asynchronous state variable is chosen locally and equal to an offset from the stationary value of the asynchronous state variable, which offset is smaller than 10% of an expected value of a maximum amplitude of the asynchronous state variable.

18. The method of claim 1, wherein for a switch-on process of a series circuit or for the switch-off process of a parallel circuit a DC component of the desired value and of the actual value of the asynchronous state variable are subtracted.

19. The method of claim 1, wherein an amplitude of the switching signal, for which the control loop offset corresponds to a too high or too low gradient, is increased or decreased in the same or in one of the next switching cycles.

20. The method of claim 19, wherein a first sample time is chosen at a small temporal distance to a reference time of the synchronous event and a difference between the sampling times is approximated by a second sampling time.

21. The method of claim 7, wherein the reference time is chosen close to the desired time value and the control loop offset is approximated by means of the actual time value.

22. The method of claim 5, wherein
a) for a series circuit, a collector-emitter or an anode-cathode voltage or a collector-emitter or anode-cathode voltage gradient is chosen as asynchronous state variable, or, for a parallel circuit a collector or anode current or a collector current gradient or an anode current gradient, and/or
b) for a series circuit, a collector current or an anode current or a collector current gradient or an anode current gradient is chosen as a synchronous state variable or, for a parallel circuit, a collector-emitter or anode-cathode voltage or a collector-emitter or anode-cathode voltage gradient.

23. The method of claim 1, wherein the synchronous event is defined by opposite amplitude changes of asynchronous state variables of different semiconductor power switches.

24. The method of claim 23, wherein the synchronous event is chosen at the beginning of a switching process by choosing an offset of the threshold value from a stationary value of the synchronous state variable smaller than 10% of an expected value of a maximum amplitude of the synchronous state variable.

25. The method of claim 1, wherein for a switch-on process of a series circuit the synchronous event is defined approximately by the time when in a phase B, in which a free wheeling diode in series to the series circuit is in a blocking state, the asynchronous state variable falls below a given threshold value.

26. The method of claim 1, wherein the synchronous event is defined by a change between a phase A, in which a free wheeling diode arranged in series to the circuit is in a conducting state, and a phase B, in which the free wheeling diode is in a blocking state.

27. The method of claim 5, wherein for a switch-off process of a parallel circuit, the synchronous event is defined approximately by the time when in a phase A, in which a free wheeling diode arranged in series to the parallel circuit is in a conducting state, the asynchronous state variable falls below a given threshold value.

28. The method of claim 5, wherein for a switch-on process of a series circuit the synchronous event is defined approximately by the time when in a phase B, in which a free wheeling diode in series to the series circuit is in a blocking state, the asynchronous state variable falls below a given threshold value.

29. The method of claim 5, wherein the synchronous event is defined by a change between a phase A, in which a free wheeling diode arranged in series to the circuit is in a conducting state, and a phase B, in which the free wheeling diode is in a blocking state.

30. The method of claim 1, wherein for the switch-on process of a series circuit a reference time of the synchronous event is chosen to be equal to a time when a collector-emitter or anode-cathode voltage falls below a threshold value, in particular wherein the threshold value is smaller than an expected value of the collector-emitter or anode-cathode voltage at an end of a phase A during which a free wheeling diode arranged in series to the serial circuit is in a conducting state.

31. The method of claim 1, wherein the switching signal is a gate current, a gate voltage or a time integral of the gate current.

32. The method of claim 1, wherein the switching command is transferred from a central control to at least one first semiconductor power switch and a switching process is detected by second semiconductor power switches and, as a consequence in particular by observation of changes of synchronous or asynchronous state variables, local switching commands are generated.

33. The method of claim 1, wherein the semiconductor power switches are BJTs, IGBTs, MOSFETs, thyristors, GTOs, MCTs or combinations of such devices.

* * * * *